(12) United States Patent
Tai et al.

(10) Patent No.: US 8,301,316 B2
(45) Date of Patent: Oct. 30, 2012

(54) SYSTEM AND METHOD FOR ORIENTING A BAFFLE PROXIMATE AN ARRAY OF FANS THAT COOL ELECTRONIC COMPONENTS

(75) Inventors: Mun Hoong Tai, Singapore (SG); Chee Kit John Chan, Chicago, IL (US); Su Nee Chin, Singapore (SG); Siang Aun Yeoh, Singapore (SG)

(73) Assignee: Hewlett-Packard Develpment Company, L.P., Houston, TX (US)

( * ) Notice: Subject to any disclaimer, the term of this patent is extended or adjusted under 35 U.S.C. 154(b) by 298 days.

(21) Appl. No.: 12/693,124

(22) Filed: Jan. 25, 2010

(65) Prior Publication Data

US 2011/0184568 A1    Jul. 28, 2011

(51) Int. Cl.
*G05D 23/00* (2006.01)

(52) U.S. Cl. .......... 700/300; 700/282; 374/11; 361/695; 174/650

(58) Field of Classification Search .................. 700/282, 700/300; 374/11; 361/695; 174/650
See application file for complete search history.

(56) References Cited

U.S. PATENT DOCUMENTS

| | | | | |
|---|---|---|---|---|
| 6,108,203 | A  * | 8/2000 | Dittus et al. | 361/695 |
| 6,883,445 | B2 * | 4/2005 | Mayerle | 111/175 |
| 7,104,403 | B1 * | 9/2006 | Stephens et al. | 209/20 |
| 7,990,710 | B2 * | 8/2011 | Hellriegel et al. | 361/699 |
| 2003/0030976 | A1 * | 2/2003 | Garnett et al. | 361/683 |
| 2004/0206283 | A1 * | 10/2004 | Mayerle | 111/130 |
| 2005/0159844 | A1 * | 7/2005 | Sigafus et al. | 700/275 |
| 2008/0288193 | A1 * | 11/2008 | Claassen et al. | 702/61 |
| 2009/0190625 | A1 * | 7/2009 | Chung et al. | 374/11 |
| 2009/0260874 | A1 * | 10/2009 | Eckberg et al. | 174/650 |
| 2010/0328889 | A1 * | 12/2010 | Campbell et al. | 361/700 |

* cited by examiner

*Primary Examiner* — Mohammad Ali
*Assistant Examiner* — Anthony Whittington
(74) *Attorney, Agent, or Firm* — Angela Mae Coxe

(57) ABSTRACT

A baffle is provided proximate an array of fans used to cool electronic components. The baffle may assume different orientations with respect to the array of fans.

8 Claims, 9 Drawing Sheets

SYSTEM AND METHOD FOR ORIENTING A BAFFLE PROXIMATE AN ARRAY OF FANS THAT COOL ELECTRONIC COMPONENTS

BACKGROUND

In the art of computing, it is desirable to provide redundancy so that a computer system can continue to function after the failure of a component. Cooling redundancy allows a computer system to continue to function when a cooling component, such as a cooling fan, fails.

In the prior art, cooling redundancy is provided in many forms, such as providing additional cooling fans, rotating remaining fans at a higher speed in the event of a fan failure, and mounting cooling fans coaxially. However, each cooling fan occupies a unique physical location, and when a fan fails, it can be a challenge to replicate the airflow lost at the location of the failed fan.

BRIEF DESCRIPTION OF THE DRAWINGS

The Figures depict embodiments, examples, implementations, and configurations of the invention, and not the invention itself.

DETAILED DESCRIPTION

In the foregoing description, numerous details are set forth to provide an understanding of the present invention. However, it will be understood by those skilled in the art that the present invention may be practiced without these details. While the invention has been disclosed with respect to a limited number of embodiments and examples, those skilled in the art will appreciate numerous modifications and variations therefrom. It is intended that the appended claims cover such modifications and variations as fall within the true spirit and scope of the invention.

Examples of the present invention relate to arrays of cooling fans, with one or more movable baffles located proximate the array of cooling fans. When a cooling fan fails, the baffle is moved to deflect air in the direction of the failed fan and expose additional cards to the remaining cooling fans.

Figure 1:
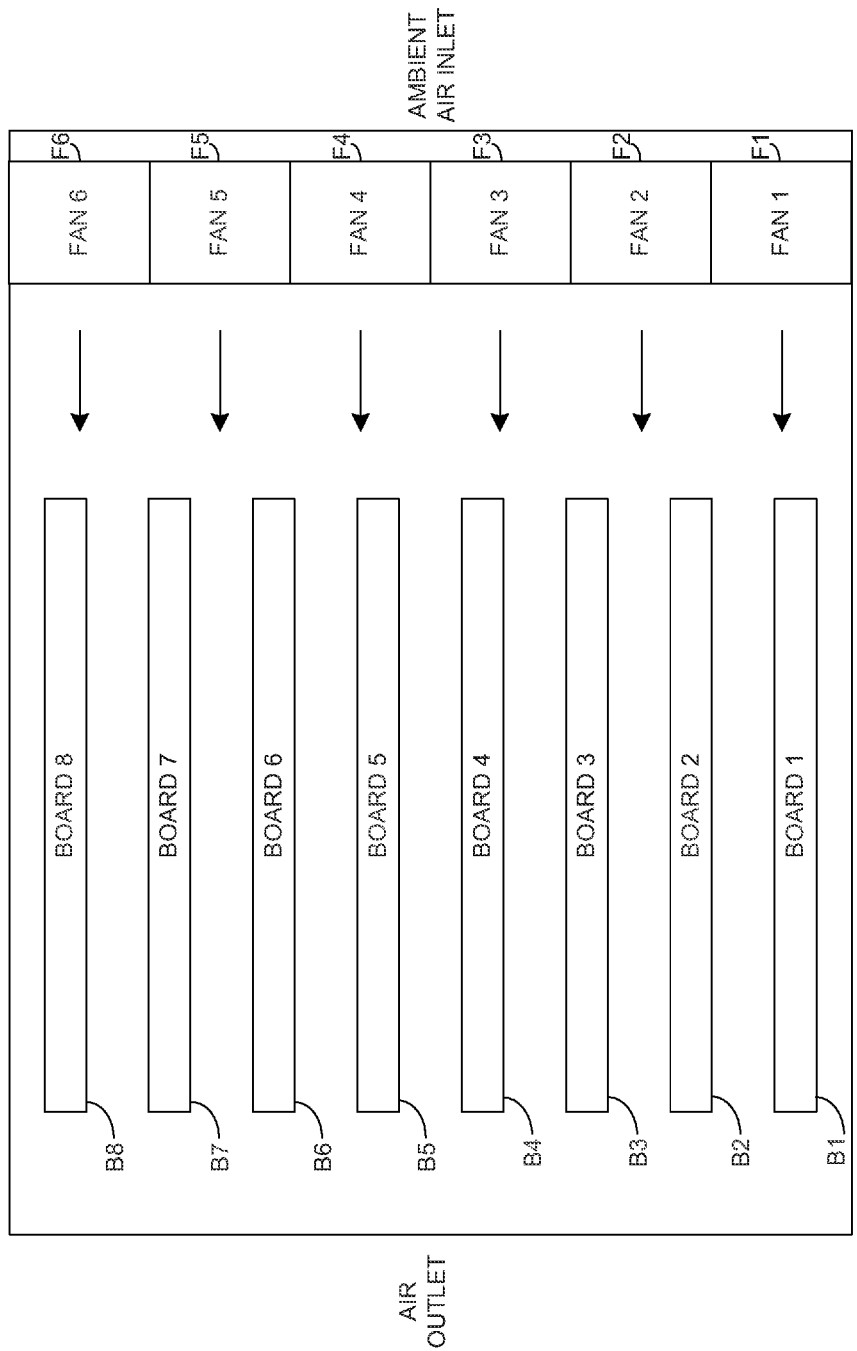
FIG. 1 is a block diagram of a typical system comprising boards and cooling fans.

FIG. 1 is a block diagram of a typical system 10 comprising boards B1, B2, B3, B4, B5, B6, B7, and B8, and fans F1, F2, F3, F4, F5, and F6. Cooling air is drawn in by the fans F1-F6 and is routed over the boards B1-B8 in the direction shown by the arrows. Heated air exits the rear of system 10.

Since the fans are linearly aligned with the boards, and the resistance to airflow is relatively even along the boards, the airflow tends to flow relatively straight, as indicated by the arrows.

Figure 2:
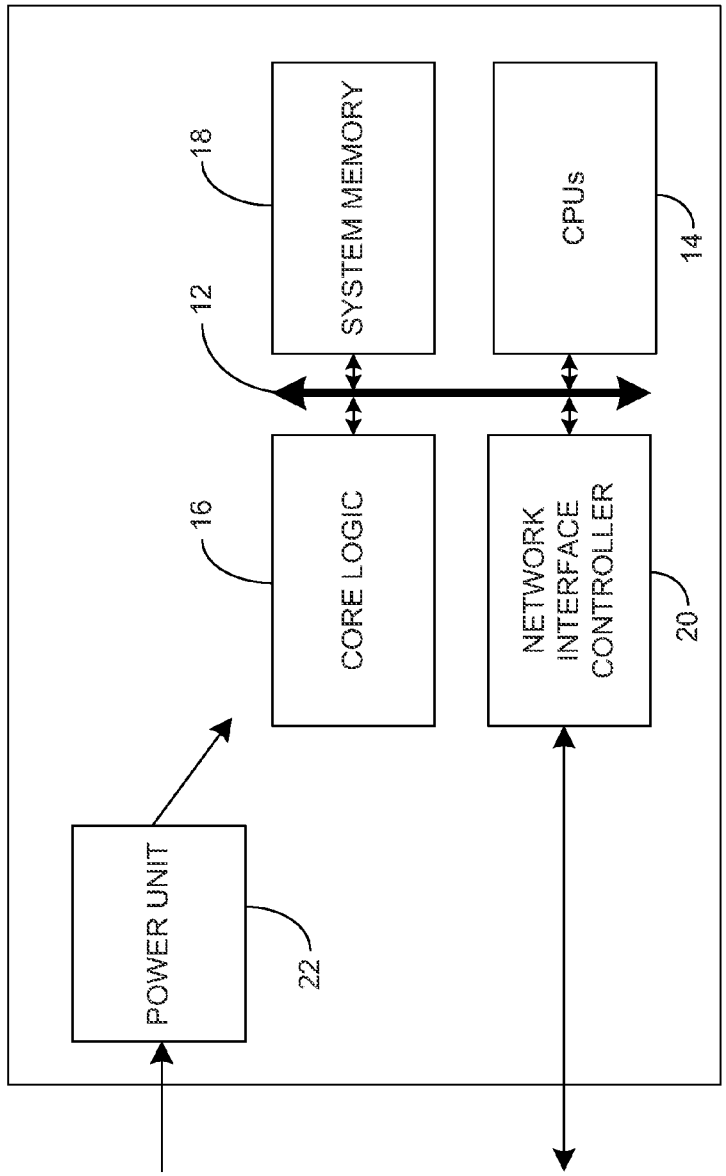
FIG. 2 shows a block diagram representing one of the boards of FIG. 1 as a server blade.

System 10 is shown generically, and may represent any system having circuit boards cooled by fans. One common configuration is a blade server, with each board representing a blade. FIG. 2 shows a block diagram representing board B1 as a server blade.

In FIG. 2, board B1 includes a bus 12. Coupled to bus 12 are one or more CPUs 14, core logic 16, system memory 18, and network interface controller 20. Also shown is power unit 22, which receives external power and distributes power to the components of board B1. For simplicity, the power connections to the components are not shown in FIG. 2.

Although bus 12 is shown generically as a single bus, those skilled in the art will recognize that typically a variety of busses and fabrics are used to connect the components shown in FIG. 2. CPUs 14 may represent a single CPU, multiple CPUs in individual integrated circuit (IC) packages, multiple CPU cores in a discrete IC package, or any combination of these elements. Core logic 16 represents the core logic that couples CPUs 14, system memory 18, and network interface controller 20. In some architectures, core logic 16 includes a Northbridge and a Southbridge. However, other architectures are known in the art. For example, in some architectures, the memory controller is provided in the CPU. For the purposes of describing embodiments of the present invention, core logic 16 also includes other components found in a typical computer system, such as firmware and I/O components, disk controllers, USB ports, video controllers, and the like. In a server blade, some of these components may not be utilized. Furthermore, persistent storage, such as hard disk drives and solid state drives, is not shown in FIG. 2. While some blades include persistent storage, often storage is provided elsewhere, with the storage accessed via network interface controller 20, or a storage interface, such as a SCSI controller.

Note that a blade server may also have boards that perform other functions, such as boards dedicated to managing network I/O and storage, or a board that performs functions associated with a service processor. In other systems, system 10 may have boards that perform other functions, such as video processing in a video application, or patient monitoring in a medical application. Further description of such applications is not necessary for an understanding of examples of the present invention.

Returning to FIG. 1, if one of the fans F1-F6 fails, the airflow from the remaining fans will continue to provide cooling, but the cooling will not be even across boards B1-B8. As an example, consider Table 1, which shows temperature measured at each board B1-B8 during normal operation of a typical system 10 with all fans F1-F6 operating.

TABLE 1

| Ambient | B1 | B2 | B3 | B4 | B5 | B6 | B7 | B8 |
|---|---|---|---|---|---|---|---|---|
| 25.0° C. | 61.0° C. | 57.8° C. | 61.5° C. | 61.0° C. | 64.6° C. | 60.2° C. | 58.1° C. | 72.3° C. |

Now assume that fan F1 has failed. The temperatures measured at each board are shown below in Table 2.

TABLE 2

| Ambient | B1 | B2 | B3 | B4 | B5 | B6 | B7 | B8 |
|---|---|---|---|---|---|---|---|---|
| 25.0° C. | 104.3° C. | 78.4° C. | 55.3° C. | 60.7° C. | 62.0° C. | 59.9° C. | 57.9° C. | 72.7° C. |

As can be seen by comparing Tables 1 and 2, all boards are still being cooled after the failure of fan F1. However, the cooling is much less even, with boards B1 and B2 proximate failed fan F1 having higher temperatures.

Figure 3:
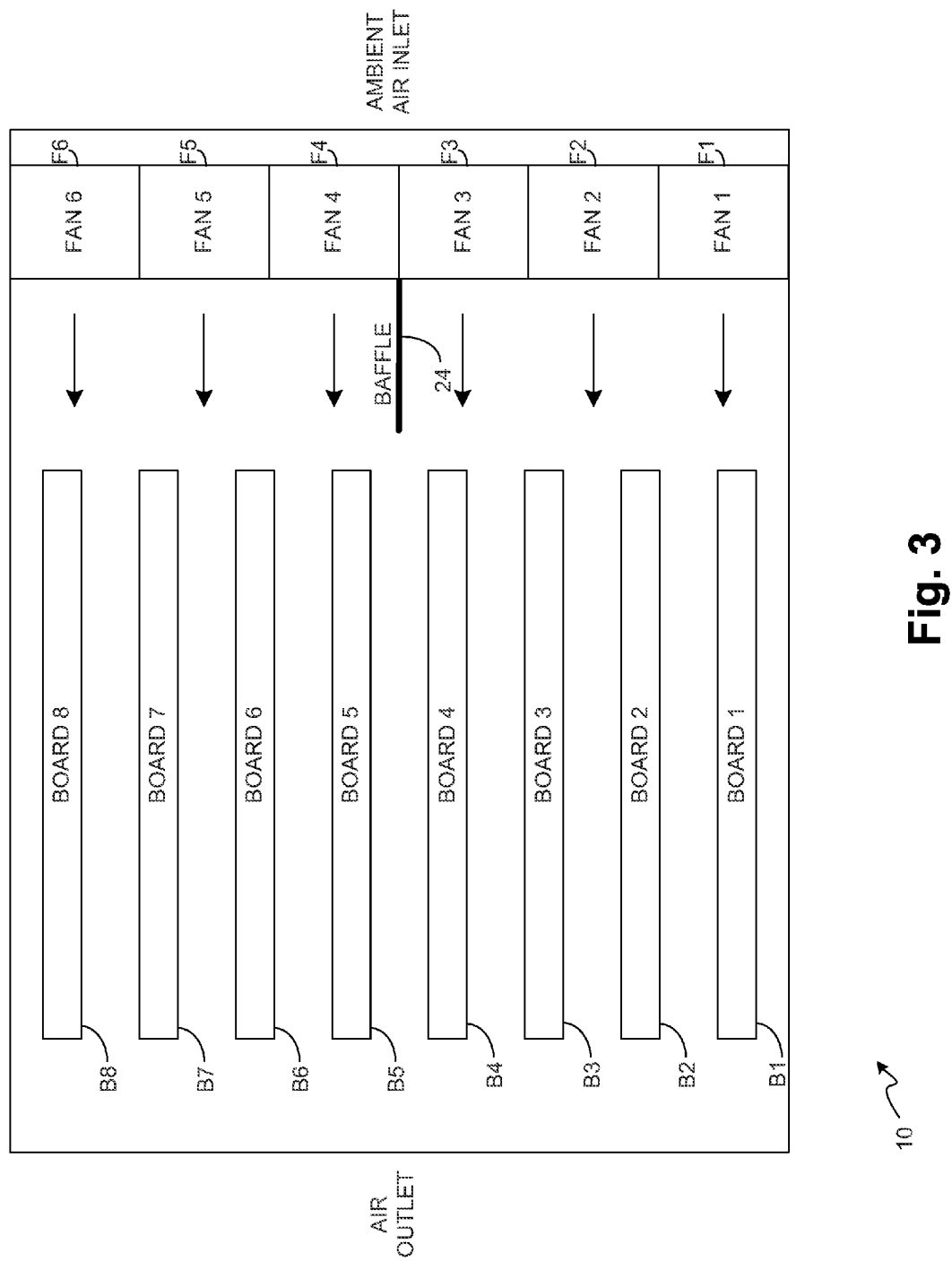
FIG. 3 is a block diagram of the system of FIG. 1 in which a movable baffle has been added, in accordance with examples of the present invention.

FIG. 3 is a block diagram of system 10 of FIG. 1 in which a baffle 24 has been added, in accordance with examples of the present invention. The baffle may be angled toward a failed fan to provide additional cooling for the area normally cooled by the failed fan. Furthermore, the baffle may be angled for other reasons, such as providing additional cooling for a board that is running hotter than the other boards. Table 3 shows temperatures measured at each board when all fans F1-F6 are operating normally, with baffle 24 oriented at 90° with respect to fans F1-F6.

TABLE 3

| Ambient | B1 | B2 | B3 | B4 | B5 | B6 | B7 | B8 |
|---|---|---|---|---|---|---|---|---|
| 25.0° C. | 59.9° C. | 58.1° C. | 59.1° C. | 62.1° C. | 60.5° C. | 60.5° C. | 58.2° C. | 72.9° C. |

Figure 4:
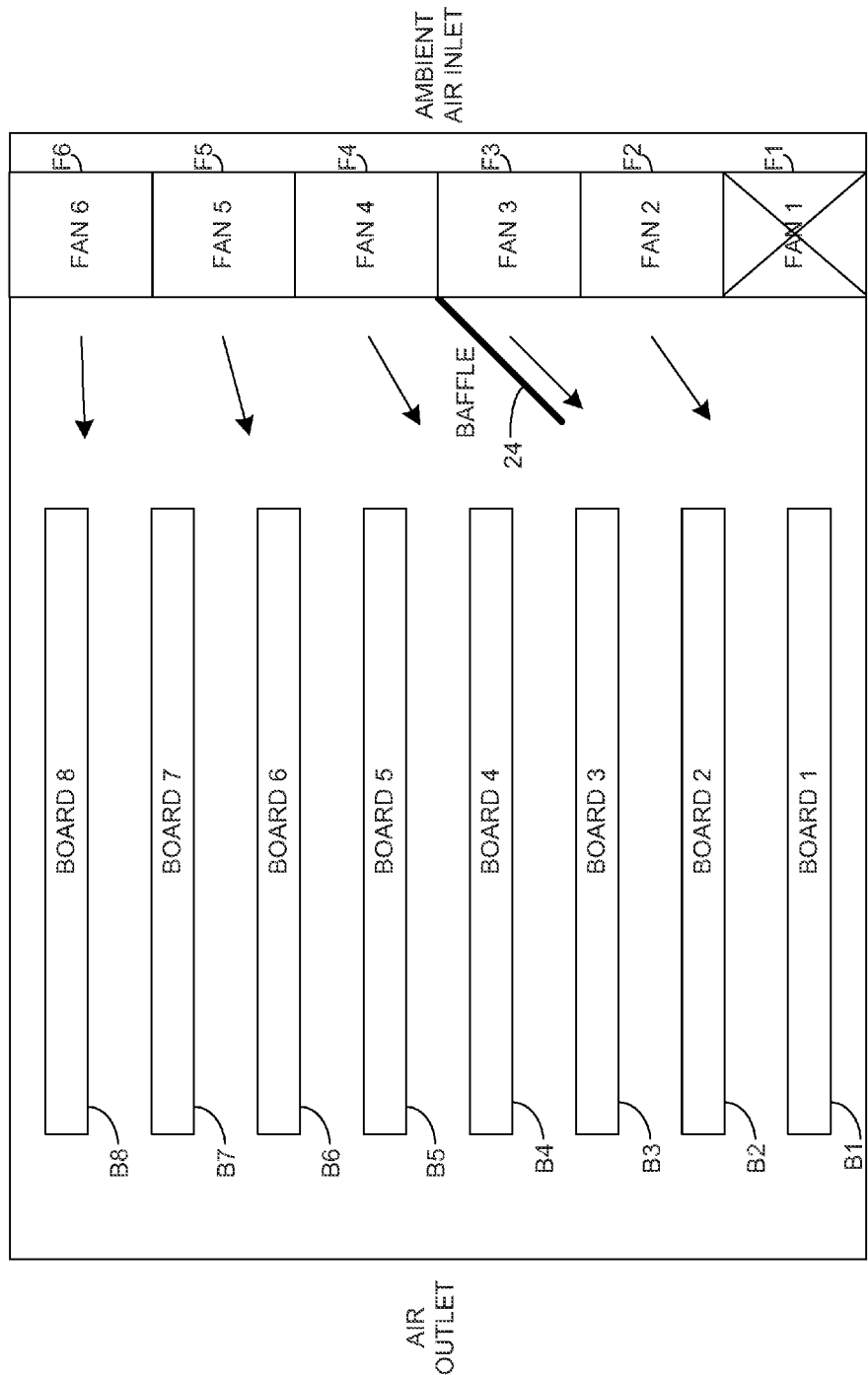
FIG. 4 shows the system of FIG. 3 after a fan farthest from the baffle has failed, and the baffle has been oriented at 45° toward the failed fan, in accordance with examples of the present invention.

FIG. 4 shows system 10 of FIG. 3 after fan F1 has failed, and baffle 24 has been oriented at 45° toward failed fan F1. Note that angles of orientation discussed herein are with reference to the array of fans. For example, a 90° orientation orients the baffle perpendicular to the array of fans, and an 80° orientation toward a failed fan moves the baffle 10° toward the failed fan. Furthermore, angles of orientation toward a failed fan or board may be referred to as being greater or less than other angles. In general, these comparisons are made with respect to the magnitude of deflection toward the fan or board, so a baffle having an 80° orientation toward a failed fan in either direction has a greater angle of orientation than a baffle having a 90° orientation. Similarly, a baffle having an 80° orientation toward a failed fan has a smaller angle of orientation than a baffle having a 45° orientation toward a failed fan As can be seen in FIG. 4, baffle 24 directs airflow from fans F3 and F2 toward the failed fan F1. Furthermore, the orientation of baffle 24 provides additional exposure of boards B3 and B4 to fans F4-F6, thereby allowing fans F4-F6 to replace some of the airflow being diverted from fan F3 by baffle 24. Table 4 shows temperatures measured at each board when fan F1 has failed, fans F2-F6 are operating normally, and baffle 24 oriented at 45° toward failed fan F1.

As discussed above, Table 2 shows measured temperatures of each board after fan F1 has failed without the example embodiment of the present invention. Comparing Tables 2 and 4, one can see that the 45° orientation of baffle 24 has lowered the temperature of board B1 by 14.8° C., and board B2 by 22.8° C. The temperature of board B3 is lowered by a relatively small 1.5° C. The temperature of board B4 actually increases from 60.7° C. to 80.7° C., but this increase is acceptable and board B3 is still running cooler than board B1. Board B5 also runs a relatively small 2° C. hotter, and the temperatures at boards B6-B8 remain relatively constant (within 0.3° C.). After a fan failure, the boards proximate the failed fan suffer the highest risk of running hot. As Tables 2 and 4 demonstrate, examples of the present invention redistribute the airflow from the remaining fans to cause the other boards to help shoulder the burden of the failed fan, thereby minimizing the risk of the boards proximate the failed fan overheating and failing until the failed fan can be replaced.

A failure of a fan at the end of an array of fans, as shown in FIG. 4, represents the most challenging fan failure since there is only one immediately adjacent fan to provide airflow in the area of the failed fan. According, a failure of a fan not on the end is less critical.

Figure 5:
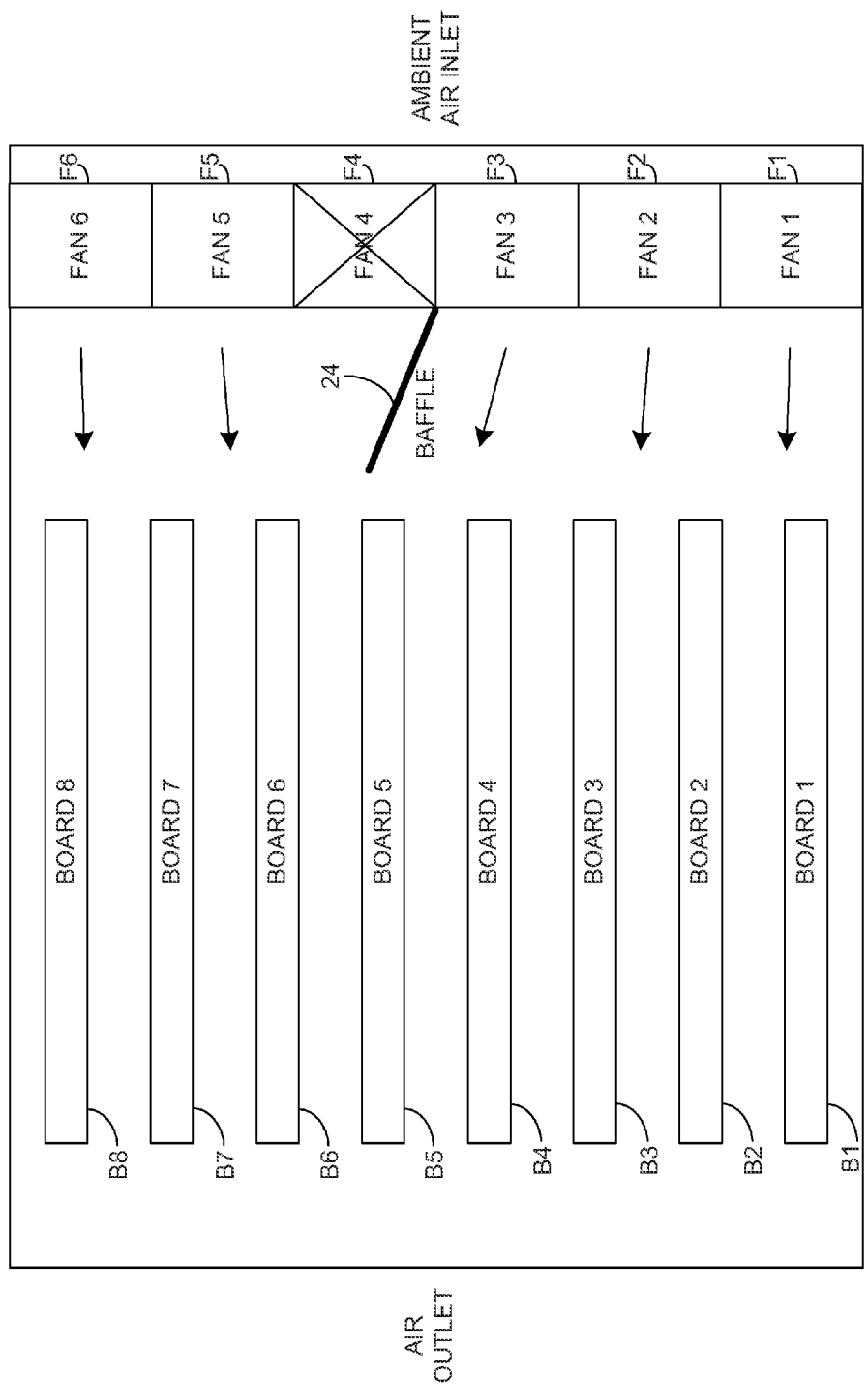
FIG. 5 shows the system FIG. 3 after a fan adjacent to the baffle has failed, with the baffle oriented at 67.5° toward failed fan, in accordance with examples of the present invention.

FIG. 5 shows system 10 after fan F4 has failed, with baffle 24 oriented at 67.5° toward fan F4. Since fans F3 and F5 are adjacent to the failed fan F4, a smaller deflection of baffle 24 is sufficient to redistribute airflow among the boards.

As mentioned above, a failure of a fan at an end of an array of fans is challenging because there are not two adjacent functioning fans. Such a failure is also challenging because the end fans are the farthest fans from baffle 24 in the examples shown in FIGS. 3-5. The example of the invention shown in FIG. 6 better addresses this challenge.

Figure 6:
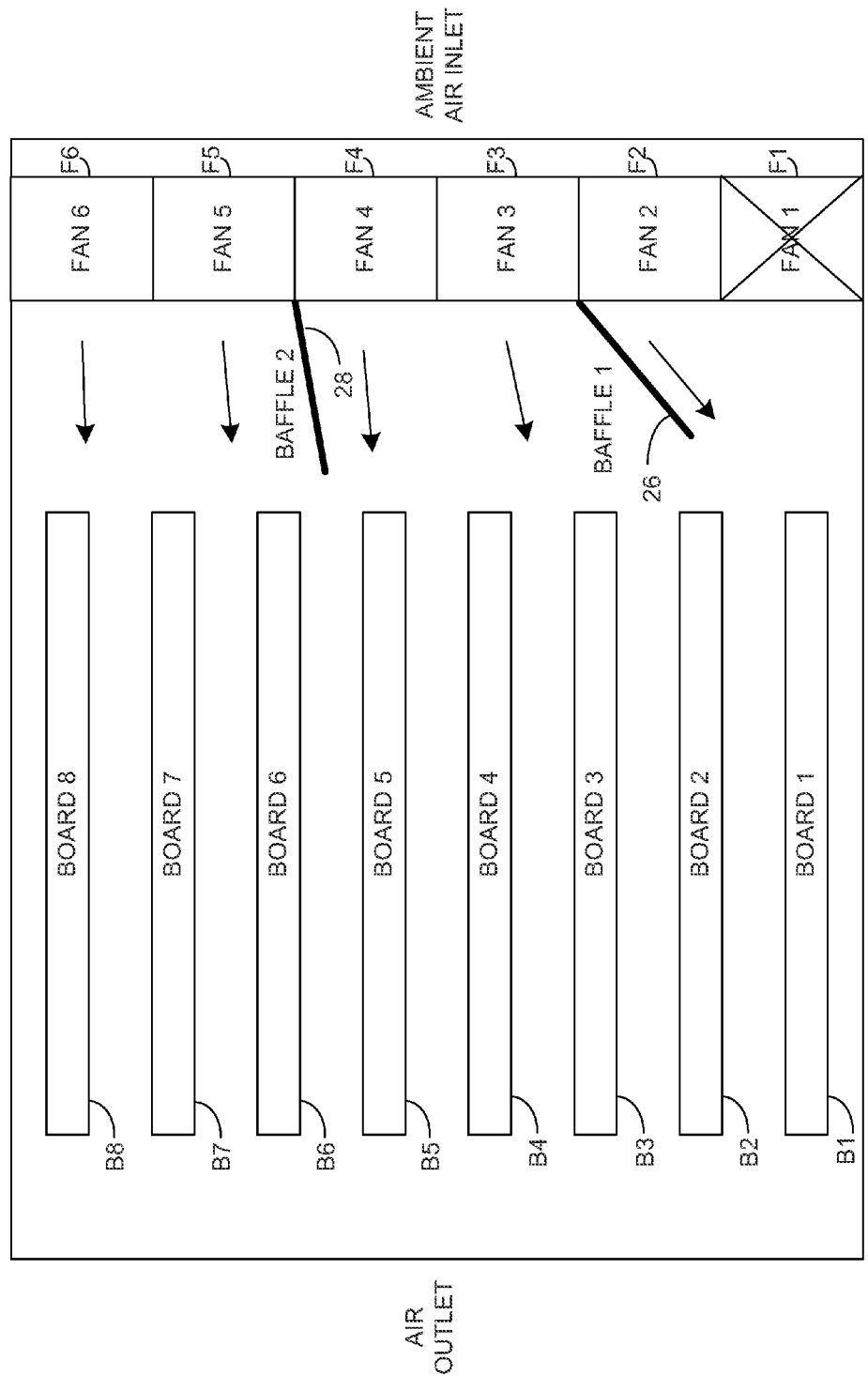
FIG. 6 shows the system of FIG. 1 with two baffles and a failed fan, with the baffle closer to the failed fan oriented at 50° toward the fan, and the baffle farther from the failed fan oriented at 80° toward fan, in accordance with examples of the present invention.

FIG. 6 shows system 10 with two baffles. Baffle 26 is positioned between fans F2 and F3, and baffle 28 is positioned between fans F4 and F5. Accordingly, there is a baffle closer to each of the end fans F1 and F6. In FIG. 6, fan F1 has failed. Since baffle 26 is closer to fan F1, baffle 26 is oriented at 50° toward fan F1, and baffle 28 is oriented at 80° toward fan F1.

TABLE 4

| Ambient | B1 | B2 | B3 | B4 | B5 | B6 | B7 | B8 |
|---|---|---|---|---|---|---|---|---|
| 25.0° C. | 89.4° C. | 55.6° C. | 53.8° C. | 80.7° C. | 60.0° C. | 59.9° C. | 57.7° C. | 73.0° C. |

Since baffle 26 is closer to fan F1, more airflow is deflected toward board B1, and the deflection of baffle 28 helps compensate for the loss of airflow to board B3. Accordingly, the example shown in FIG. 6 is able to distribute more evenly the airflow of the remaining fans to the boards.

The most desirable angles of orientation can be found by experimentation of the system designer by simulating fan failures and testing different angles. Examples of the present invention may also be combined with other prior art techniques, such as rotating remaining fans faster and adjusting workloads serviced by the boards.

Figure 7:
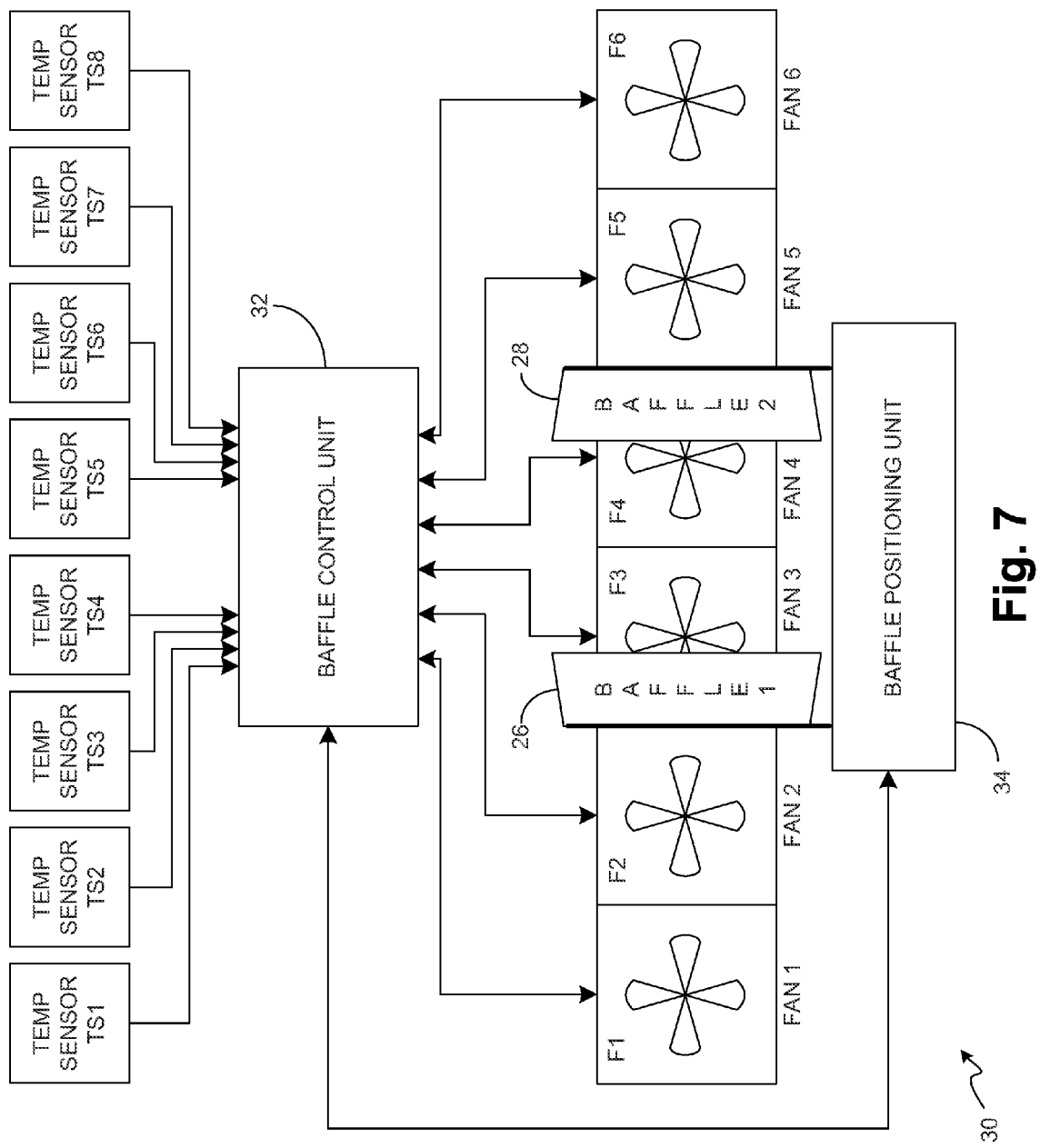
FIG. 7 is a block diagram of an example of the present invention, and includes a baffle control unit, two baffles, a baffle positioning unit, temperature sensors, and fans, in accordance with examples of the present invention.

FIG. 7 is a block diagram 30 of an example of the present invention, and includes baffle control unit 32, baffles 26 and 28, baffle positioning unit 34, temperature sensors TS1, TS2, TS3, TS4, TS5, TS6, TS7, and TS8, and fans F1, F2, F3, F4, F5, and F6.

Baffle control unit 32 is coupled to temperature sensors TS1-TS8, with each temperature sensor reporting the temperature of a board. The temperature sensors are shown generically, and represent any temperature sensing mechanism known in the art, such as I2C bus connections that can relay CPU temperatures from internal temperature sensors in the CPU ICs. As will be discussed below, in some examples of the present invention, the baffles may be oriented to provide additional cooling to boards that are running hotter than other boards.

Baffle control unit 32 is also coupled to fans F1-F6. Unit 32 monitors the fans to detect failure, and may also control fan operation.

Finally, baffle control unit 32 is coupled to baffle positioning unit 34, which in turn is coupled to baffles 26 and 28. Under control of baffle control unit 32, baffle positioning unit 34 operates to orient baffles 26 and 28 at a desired angle of orientation with respect to the array of fans F1-F6. Baffle positioning unit 34 may use any appropriate positioning mechanisms known in the art, such as stepper motors, piezoelectric motors, solenoids, voice coil actuators, and the like. Furthermore, although baffle positioning unit 34 is shown as a single unit, it may be implemented using multiple units. For example, a discrete positioning mechanism may be provided for each baffle.

Note that the components shown in FIG. 7 may be provided in various elements of system 10. For example, baffle control unit 32 may be provided as a stand-alone device. Alternatively, baffle control unit 32 may be implemented as part of a service processor, or may execute as a control loop on one of the blades in a blade server.

FIGS. 8-11 are flow charts illustrating how the baffles may be controlled. The actions shown in the flow charts may be implemented by baffle control unit 32 in FIG. 7, or any other device used to control examples of the invention.

Figure 8:
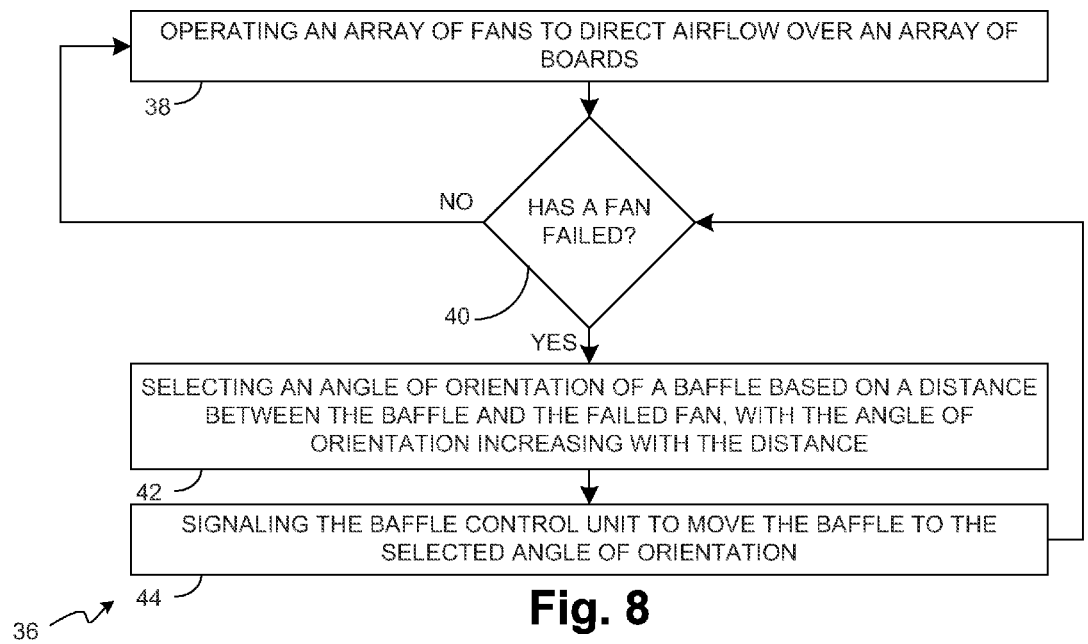
FIG. 8 shows a flow chart that illustrates a how a single baffle is controlled to respond to a fan failure, in accordance with examples of the present invention.

FIG. 8 shows a flow chart 36 that illustrates a how a single baffle is controlled to respond to a fan failure. Block 38 operates an array of fans to direct airflow over an array of boards, with a default baffle orientation suitable for normal operation with all fans functioning. As discussed above, a typical angle of orientation of the baffle with respect to the array of fans when all fans are operating is 90°, but it may be desirable to use a different orientation during normal operation, such as a slight deflection to provide additional cooling for a board that runs slightly hotter than the other boards. Control passes to decision block 40. Decision block 40 detects whether a fan has failed. If a fan has not failed, the NO branch is taken to block 38, and operation and monitoring of the fans continues. If a fan has failed, the YES branch is taken to block 42.

At block 42, an angle of orientation of the baffle is selected based on a distance between the baffle and the failed fan, with the angle of orientation increasing with the distance. As shown in FIG. 4, a 45° deflection is used when the failed fan is the third fan from the baffle, and in FIG. 5, a 67.5° deflection is used when the failed fan is adjacent to the baffle. However, those skilled in the art will recognize that other angles may be used. Control passes to block 44.

Block 44 signals the baffle control unit to move the baffle to the selected angle of orientation. At this point, operation continues with the failed fan and the baffle redirects airflow to compensate for the airflow lost by the fan failure. At block 44, it may be desirable to perform other actions, such as signaling an operator that a fan has failed and needs to be serviced, operating remaining fans at faster rotational speeds, or moving workloads off the boards proximate the failed fan. Control passes back to decision block 40.

Block 40 continues to monitor for failed fans. In the unlikely event that a second fan fails before the first failed fan is repaired, additional steps may be performed. For example, it may be desirable to return the baffle to a 90° orientation. Alternatively, it may be desirable to use the temperature monitoring techniques discussed below with respect to FIG. 10 to find an optimal position for the baffle to maximize cooling in view of the failed fans. Finally, it may be necessary to reduce the workload on one or more boards, or power down one or more board, and use the baffle to maximize cooling to the remaining boards with the remaining fans.

Figure 9:
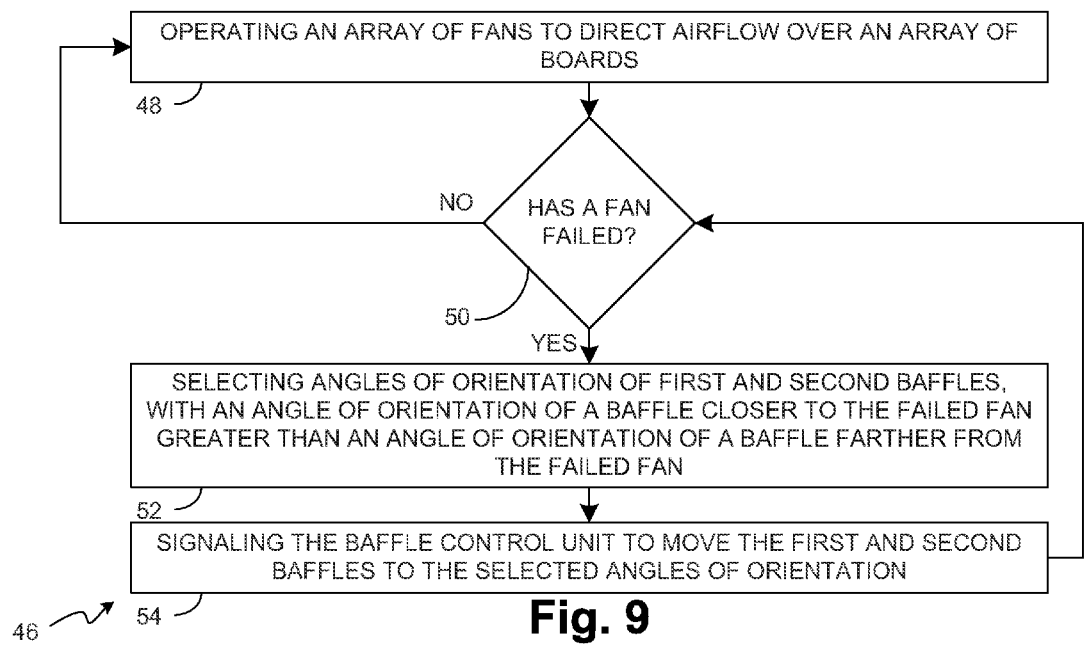
FIG. 9 shows a flow chart illustrates how two baffles are controlled to respond to a fan failure, in accordance with examples of the present invention.

FIG. 9 shows a flow chart 46 that illustrates how two baffles are controlled to respond to a fan failure. Block 48 operates an array of fans to direct airflow over an array of boards, with default baffle orientations suitable for normal operation with all fans functioning. Typical angles of orientation of the baffles with respect to the array of fans when all fans are operating are 90°, but it may be desirable to use different orientations during normal operation, such as slight deflections to provide additional cooling for a board that runs slightly hotter than the other boards. Control passes to decision block 50. Decision block 50 detects whether a fan has failed. If a fan has not failed, the NO branch is taken to block 48, and operation and monitoring of the fans continues. If a fan has failed, the YES branch is taken to block 52.

At block 52, angles of orientation of the first and second baffles are selected based on distances between the baffles and the failed fan, with the angle of orientation of the baffle closer to the failed fan greater than the angle of orientation of the baffle farther from the failed fan. If the distances are equal, the angles of orientations may be equal. As shown in FIG. 6, a 50° orientation is used for the baffle that is closest to the failed fan, and an 80° orientation is used for the baffle that is farther from the failed fan. However, these orientations are merely examples, and those skilled in the art will recognize that other angles may be used. Control passes to block 54.

Block 54 signals the baffle control unit to move the first and second baffles to the selected angles of orientation. At this point, operation continues with the failed fan and the baffles redirecting airflow to compensate for the airflow lost by the fan failure. In block 54, it may be desirable to perform other actions, such as signaling an operator that a fan has failed and needs to be serviced, operating remaining fans at faster rotational speeds, or moving workloads off the boards proximate the failed fan. Control passes back to decision block 50.

Block 50 continues to monitor for failed fans. In the unlikely event that a second fan fails before the first failed fan is repaired, additional steps may be performed. For example, it may be desirable to return the baffles to a 90° orientation. Alternatively, it may be desirable to use the temperature monitoring techniques discussed below with respect to FIG. 11 to find an optimal position for the baffles to maximize cooling in view of the failed fans. Finally, it may be necessary to reduce the workload on one or more boards, or power down one or more board, and use the baffles to maximize cooling to the remaining boards with the remaining fans.

Figure 10:
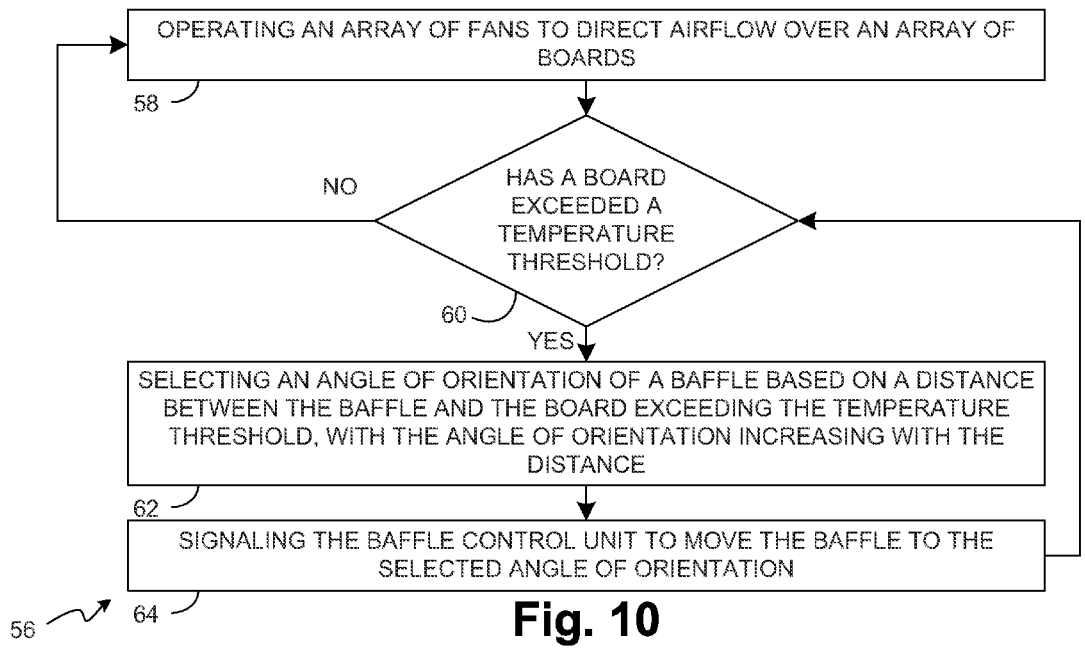
FIG. 10 shows a flow chart that illustrates a how a single baffle is controlled to respond to a board exceeding a temperature threshold, in accordance with examples of the present invention.

FIG. 10 shows a flow chart 56 that illustrates a how a single baffle is controlled to respond to a board exceeding a temperature threshold. Block 58 operates an array of fans to direct airflow over an array of boards. As discussed above, a typical orientation of 90° may be used, or other default orientations may be used. Control passes to decision block 60. Decision block 60 detects whether a board has exceeded a temperature threshold. A designer may select a suitable threshold, such as 85° C. or 90° C. that is appropriate in view of the thermal tolerances of the boards. If a board has not exceeded a temperature threshold, the NO branch is taken to block 58, and operation of the fans and monitoring of the board temperatures continues. If a board has exceeded a temperature threshold, the YES branch is taken to block 62.

At block 62, an angle of orientation of the baffle is selected based on a distance between the baffle and the board exceeding the temperature threshold, with the angle of orientation increasing with the distance. It may also be desirable to base the angle of orientation on the magnitude by which the measured board temperature exceeds the temperature threshold. Control then passes to block 64.

Block 64 signals the baffle control unit to move the baffle to the selected angle of orientation. Control passes back to decision block 60, and monitoring of board temperatures and adjustment of the baffle continues. It may be desirable to perform other actions, such as signaling an operator that a board is running hot, operating fans at faster rotational speeds, or moving workloads off the board that is running hot.

Figure 11:
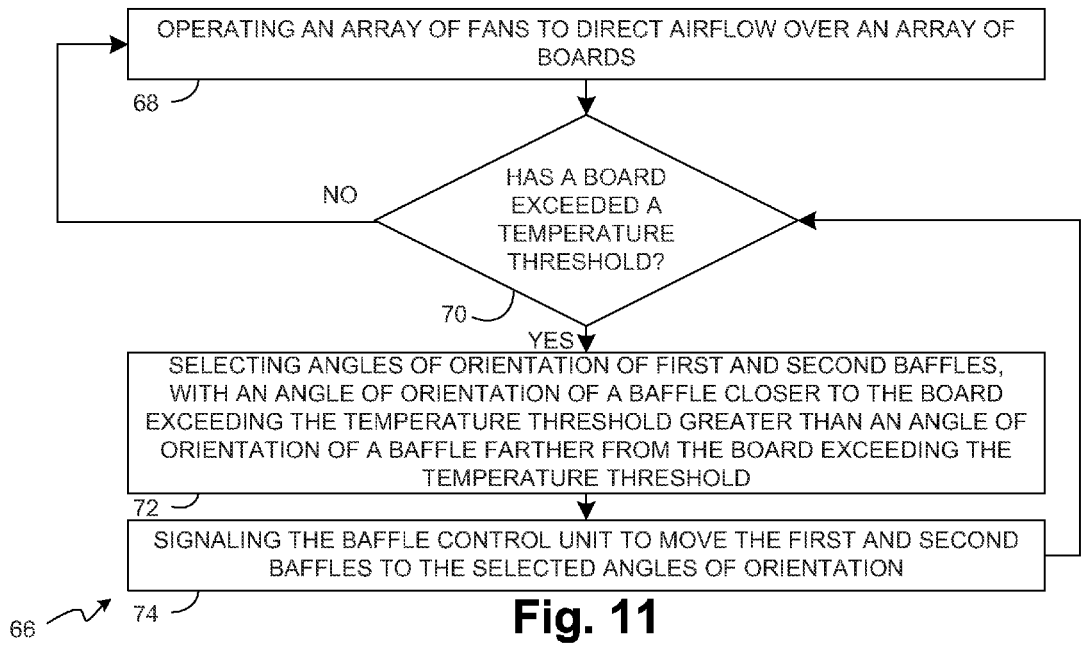
FIG. 11 shows a flow chart that illustrates how two baffles are controlled to respond to a board exceeding a temperature threshold, in accordance with examples of the present invention.

FIG. 11 shows a flow chart 66 that illustrates how two baffles are controlled to respond to a board exceeding a temperature threshold. Block 68 operates an array of fans to direct airflow over an array of boards. As discussed above, a typical orientation of 90° may be used, or other default orientations may be used. Control passes to decision block 70. Decision block 70 detects whether a board has exceeded a temperature threshold. A designer may select a suitable threshold, such as 85° C. or 90° C. that is appropriate in view of the thermal tolerances of the boards. If a board has not exceeded a temperature threshold, the NO branch is taken to block 68, and operation of the fans and monitoring of the board temperatures continues. If a board has exceeded a temperature threshold, the YES branch is taken to block 72.

At block 72, angles of orientation of the first and second baffles are selected based on distances between the baffles and the board exceeding the temperature threshold, with the angle of orientation of the baffle closer to the board exceeding the temperature threshold greater than the angle of orientation of the baffle farther from the board exceeding the threshold. If the distances are equal, the angles of orientations may be equal. It may also be desirable to base the angles of orientation on the magnitude by which the measured board temperature exceeds the temperature threshold. Control passes to block 74.

Block 74 signals the baffle control unit to move the baffles to the selected angles of orientation. Control passes back to block 70, and monitoring of board temperatures and adjustment of the baffles continues. It may be desirable to perform other actions, such as signaling an operator that a board is running hot, operating fans at faster rotational speeds, or moving workloads off the board that is running hot.

For simplicity, the flow charts showing how to operate the baffles in the event of fan failure and high board temperatures have been shown separately. However, it may be desirable to combine the flowcharts. For example, the board temperature flow charts may be used when all fans are operating normally, and control can pass to the failed fan flow charts when a fan failure is detected.

The present invention further increases reliability and redundancy in systems using an array of cooling fans. Even though a certain level of redundancy is provided by having multiple fans, it is a challenge to replace the airflow lost when a fan fails because the fan occupies a discrete physical location. Examples of the present invention address this challenge, and also provide opportunities to direct airflow to boards that run hotter.

In the foregoing description, numerous details are set forth to provide an understanding of the present invention. However, it will be understood by those skilled in the art that the present invention may be practiced without these details. While the invention has been disclosed with respect to a limited number of examples and embodiments, those skilled in the art will appreciate numerous modifications and variations therefrom. It is intended that the appended claims cover such modifications and variations as fall within the true spirit and scope of the invention.

What is claimed is:

1. A system comprising:
an array of fans, the array of fans including first and second end fans;
an array of electronic components cooled by the array of fans;
a movable baffle located between the first and second end fans;
a baffle positioning unit coupled to the movable baffle; and
a baffle control unit coupled to the baffle positioning unit and each fan of the array of fans, wherein the baffle control unit:
    signals the baffle positioning unit to orient the movable baffle to a desired angle with respect to the array of fans; and
    detects a failed fan of the array of fans, and in response to detecting a failed fan, the baffle control unit signals the baffle positioning unit to orient the movable baffle toward the failed fan.

2. The system of claim 1 wherein the desired angle of the movable baffle is selected based on a distance between the movable baffle and the failed fan, with the desired angle increasing with the distance.

3. The system of claim 1 wherein the movable baffle is a first movable baffle, and further comprising:
a second movable baffle positioned between the first and second end fans and coupled to the baffle positioning unit, wherein each fan of the array of fans is coupled to the baffle control unit to allow the baffle control unit to detect the failed fan of the array of fans, and in response to detecting the a failed fan, the baffle control unit signals the baffle positioning unit to orient the first or second movable baffle closest to the failed fan towards the failed fan.

4. The system of claim 3 wherein the baffle control unit also signals the baffle positioning unit to orient the first or second movable baffle farthest from the failed fan towards the failed fan.

5. The system of claim 4 wherein the desired angle is a first desired angle, the first desired angle of the first or second movable baffle closer to the failed fan is greater than a second desired angle of the first or second movable baffle farther from the failed fan.

6. The system of claim 1 further comprising:
an array of temperature sensors coupled to the baffle control unit, for measuring temperatures of electronic components of the array of electronic components, wherein the baffle control unit signals the baffle positioning unit to orient the movable baffle toward an electronic component of the array of electronic components that has a measured temperature above a threshold.

7. The system of claim 1 wherein the array of electronic components comprise an array of circuit boards.

8. The system of claim 7 wherein the system is a server, and the array of circuit boards comprise an array of server blades.

* * * * *

UNITED STATES PATENT AND TRADEMARK OFFICE
CERTIFICATE OF CORRECTION

PATENT NO.       : 8,301,316 B2
APPLICATION NO.  : 12/693124
DATED            : October 30, 2012
INVENTOR(S)      : Mun Hoong Tai et al.

It is certified that error appears in the above-identified patent and that said Letters Patent is hereby corrected as shown below:

On the title page, in item (73), Assignee, in column 1, line 1, delete "Develpment" and insert -- Development --, therefor.

In the Claims:

In column 8, line 39, in Claim 1, delete "unit:" and insert -- unit; --, therefor.

In column 8, line 58, in Claim 3, delete "the a" and insert -- the --, therefor.

Signed and Sealed this
Seventh Day of May, 2013

Teresa Stanek Rea
*Acting Director of the United States Patent and Trademark Office*